United States Patent
Nakao et al.

(10) Patent No.: US 8,231,046 B2
(45) Date of Patent: Jul. 31, 2012

(54) WIRE BONDING APPARATUS AND WIRE BONDING METHOD

(75) Inventors: Mitsuhiro Nakao, Yokohama (JP); Junya Sagara, Kawasaki (JP); Katsuhiro Ishida, Yokkaichi (JP); Noboru Okane, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/564,276

(22) Filed: Sep. 22, 2009

(65) Prior Publication Data

US 2010/0181367 A1    Jul. 22, 2010

Related U.S. Application Data

(62) Division of application No. 11/867,307, filed on Oct. 4, 2007, now abandoned.

(30) Foreign Application Priority Data

Oct. 26, 2006  (JP) ................................. 2006-291574

(51) Int. Cl.
*B23K 20/00* (2006.01)
*B23K 31/12* (2006.01)
(52) U.S. Cl. .................. 228/102; 228/180.5; 228/110.1; 228/4.5
(58) Field of Classification Search ................ 228/1.1, 228/4.5, 102–104, 110.1, 180.5; 73/827–835
See application file for complete search history.

(56) References Cited

U.S. PATENT DOCUMENTS

| 3,945,248 | A | 3/1976 | West |
| 5,591,920 | A * | 1/1997 | Price et al. ...................... 73/828 |
| 5,894,981 | A | 4/1999 | Kelly |
| 6,102,275 | A | 8/2000 | Hill et al. |
| 6,564,115 | B1 | 5/2003 | Kinnaird |
| 6,901,305 | B2 | 5/2005 | Kimura et al. |
| 2003/0085255 | A1 * | 5/2003 | Farassat ...................... 228/103 |

FOREIGN PATENT DOCUMENTS

| JP | 04-245451 | 9/1992 |
| JP | 07-106365 | 4/1995 |
| JP | 09-270440 | 10/1997 |
| JP | 2004-179214 | 6/2004 |

OTHER PUBLICATIONS

Definition of http://www.thefreedictionary.com/STRESS, Collins English Dictionary, 2003.*
JPO machine translation of JP 09-270440, Oct. 14, 1997.*
JPO machine translation of JP 2004-179214, Jun. 24, 2004.*
Japanese Office Action for Japanese Patent Application No. 2006-291574 Mailed on Jan. 14, 2011.
Japanese Office Action for Japanese Patent Application No. 2006-291574 mailed on Mar. 18, 2011.

* cited by examiner

*Primary Examiner* — Jessica L Ward
*Assistant Examiner* — Kevin E Yoon
(74) *Attorney, Agent, or Firm* — Turocy & Watson, LLP

(57) ABSTRACT

A wire bonding method involves bonding a wire in order at a first bonding point and a second bonding point; raising a capillary, through which the wire is inserted, on the second bonding point; cutting the wire by closing a clamper provided above the capillary at a time when the capillary has reached a prescribed height; and measuring a load incurred on the wire at a time of cutting of the wire.

4 Claims, 4 Drawing Sheets

WIRE BONDING APPARATUS AND WIRE BONDING METHOD

CROSS REFERENCE TO RELATED APPLICATIONS

This application is a Division of co-pending U.S. patent application Ser. No. 11/867,307, filed on Oct. 4, 2007, which is based upon and claims the benefit of priority from the Japanese Patent Application No. 2006-291574, filed on Oct. 26, 2006, the entire contents of which are incorporated herein by reference.

BACKGROUND OF THE INVENTION

1. Field of the Invention

The present invention is related to a wire bonding apparatus and a wire bonding method.

2. Related Art

There exists a wire bonding process, wherein an electrode on a semiconductor chip, and an inner lead formed on a wiring board or a lead frame are electrically connected with a thin metal line (a wire), as part of a semiconductor device manufacturing process.

In the wire bonding process, first, a wire is melted by applying a high voltage electric discharge to the wire (tail) protruding from a tip of a capillary, which forms a ball on the tip of the tail. Then, with the application of heat, pressure, and an ultrasonic oscillation, bonding of this ball and an electrode on a semiconductor chip is performed.

Afterward, this capillary is raised and moved atop an inner lead, and with the application of heat, pressure, or an ultrasonic oscillation, bonding of the wire and the inner lead is performed. When the bonding is complete, the capillary is raised to a prescribed height, and the wire is cut by clamping the wire.

The wire cutting on the inner lead is termed the "tail cut action", and by tail cutting, a tail of suitable length is left on the tip of the capillary. Wire bonding is performed by carrying out the above described series of actions repeatedly.

In tail cutting, the bond strength of the inner lead and the wire must be just right. For example, in a case in which the bond strength of the inner lead and the wire is too weak, the wire will detach from the inner lead thus making it impossible to perform tail cutting.

On the other hand, in a case in which the bond strength of the inner lead and the wire is too strong, the wire will be severed at the top of the inner lead, and a tail of appropriate length will not be formed. There is a problem in that if there exists no tail of appropriate length, a ball of correct shape would not be formed, whereby if wire bonding is attempted in such a state, the capillary and the electrode on the semiconductor chip would come into direct contact and thereby damage the semiconductor chip and the electrode.

In order to solve this problem, a device is proposed (For example, see Japanese Patent Laid-Open No. 07-106365) that monitors and measures the length of a tail left behind on a capillary tip after tail cutting.

Also, since a great breaking load is incurred on the wire at the time of tail cutting, a spring back phenomenon occurs after the cut, and the wire buckles (deforms). There is a problem in that since this deformed wire is used afterward in wire bonding, this deformed wire would come in contact with adjacent wire connections and create a short defect, thus reducing yield.

SUMMARY OF THE INVENTION

According to one aspect of the present invention, there is provided a wire bonding apparatus comprising:

a capillary configured to have inserted therethrough a wire;

a clamper provided above the capillary and able to clamp hold the wire; and a load sensor configured to measure load incurred on the wire.

According to one aspect of the present invention, there is provided a wire bonding apparatus comprising:

a capillary configured to have inserted therethrough a wire;

a transducer horn configured at one end to hold in place the capillary;

a clamper provided above the capillary and able to clamp hold the wire;

a clamper supporting portion that supports the clamper at one end;

a capillary moving portion to which the other ends of the transducer horn and the clamper supporting portion are fixed and which is configured to move the transducer horn and the clamper supporting portion as one; and a control apparatus that performs drive control of the capillary moving portion and the clamper, monitors an electric current value on the capillary moving portion at a time of cutting of the wire, and calculates load at a time of cutting of the wire based on the electric current value.

According to one aspect of the present invention, there is provided a wire bonding method comprising:

bonding a wire in order at a first bonding point and a second bonding point;

raising a capillary, through which the wire is inserted, on the second bonding point;

cutting the wire by closing a clamper provided above the capillary at a time when the capillary has reached a prescribed height;

measuring a load incurred on the wire at a time of cutting of the wire;

detecting whether the measured load is within a prescribed optimum breaking load range; and determining whether or not to continue bonding based on the detection result.

DETAILED DESCRIPTION OF THE INVENTION

Herein below, description, based on the FIGS., is given in regard to the embodiments of the present invention.

First Embodiment

Figure 1:
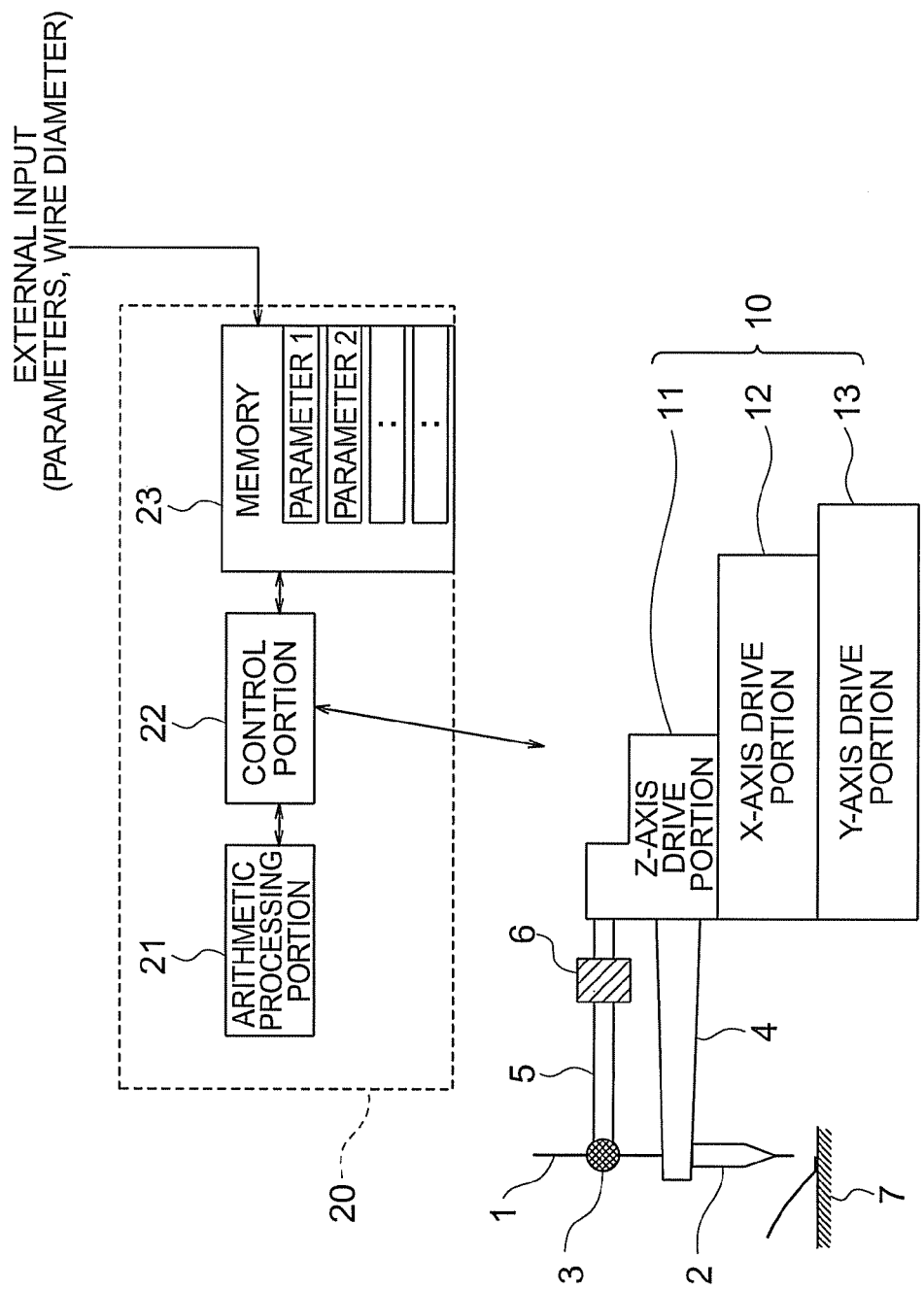
FIG. 1 is a view showing a schematic configuration of a wire bonding apparatus according to a first embodiment of the present invention.

FIG. 1 shows a view of a schematic configuration of a wire bonding apparatus according to a first embodiment of the present invention. The wire bonding apparatus includes a capillary 2 configured to have inserted therethrough with a wire 1, a clamper 3 able to clamp hold the wire 1 disposed above the capillary 2, a transducer horn 4 configured at one end to hold in place the capillary 2, a load sensor 6 that measures load incurred on the wire 1, a clamper supporting portion 5 onto which the load sensor 6 is mounted and which supports the clamper 3 at one end, a capillary moving portion 10 to which the other ends of the transducer horn 4 and the clamper supporting portion 5 are fixed and which is configured to move the capillary 2 and the clamper 3 as one, and a control apparatus 20.

The capillary moving portion 10 includes a Z-axis drive portion 11 configured to move the capillary 2 in a Z-axis direction perpendicular to a bonding subject 7, and an X-axis drive portion 12 and Y-axis drive portion 13 configured to move the capillary 2 in the directions of an X-axis and a Y-axis, which are two orthogonal directions in a plane parallel to a top surface of the bonding subject 7. The Z-axis drive portion 11, X-axis drive portion 12, and Y-axis drive portion 13 are, for example, servo motors.

The bonding subject 7 is for example an inner lead formed on a wiring board or a lead frame. Also, in the so-termed reverse bonding in which wire connection is performed from the inner lead to an electrode of the semiconductor chip, reverse bonding is performed after a bump, using wire, is formed on the chip electrode. Tail cutting action comes to be performed at the time of this bump formation as well, thus in this case the chip electrode is the bonding subject 7.

The control apparatus 20 includes an arithmetic processing portion 21, a control portion 22, and a memory 23. The memory 23 is externally allotted with and stores a plurality of parameters such as control parameters such as ultrasonic output strength and trajectory information of the capillary 2 that defines a loop shape of the wire 1, and parameters such as the wire diameter of the wire 1.

The control portion 22 performs control of the movement of the capillary moving portion 10, opening and shutting of the clamper 3, and control of ultrasonic energy given to the transducer horn at the time of bonding, based on the various parameters stored at the memory 23.

The arithmetic processing portion 21 calculates an optimum breaking load range based on the diameter of the wire 1, and performs determination of whether or not the breaking load at the time of wire cutting (tail cutting) measured by the load sensor 6 is within the optimum breaking load range. When it is determined that the breaking load is not within the optimum breaking load range, a stop signal is sent to the control portion 22 in order to stop the apparatus. A warp gauge or the like may be used as the load sensor 6.

Figure 2:
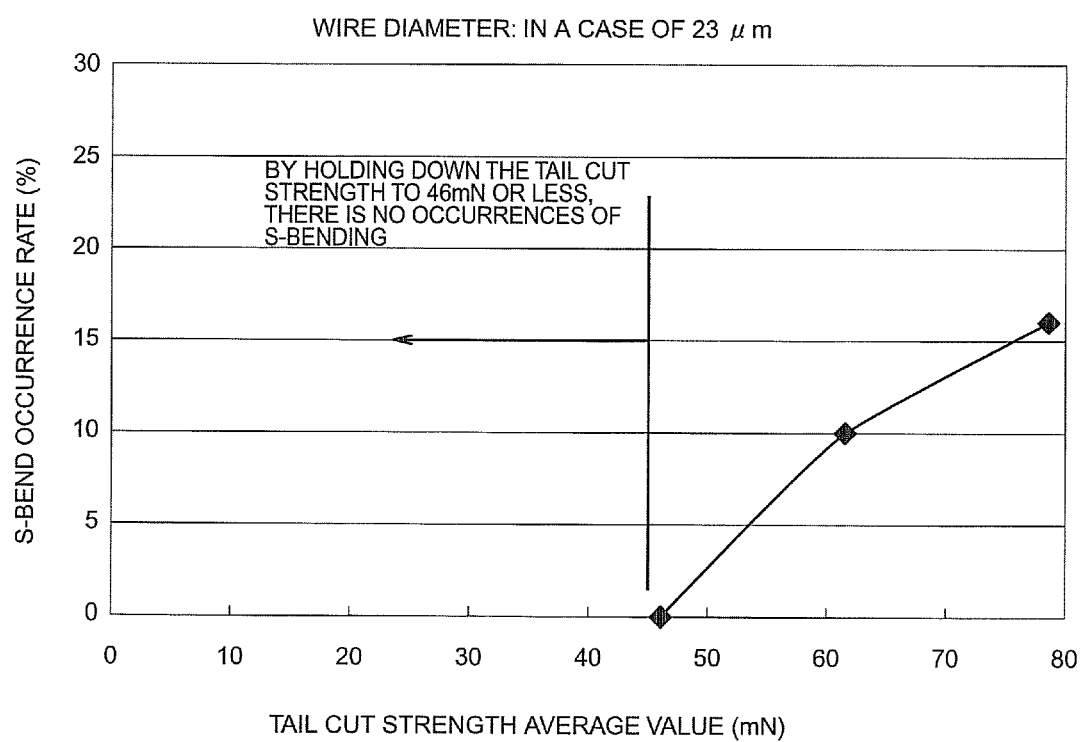
FIG. 2 is a graph showing a relationship between breaking load and wire deformation defect occurrence rate.

A graph showing the relationship between the breaking load when using a wire of a diameter of 23 µm and the wire deformation (S bending) defect occurrence rate is shown in FIG. 2. It can be understood from this graph that if the breaking load is set to 46 mN or less, the wire deformation defect will not occur. The optimum breaking load range may be set arbitrarily by a user.

Also, wire bonding conditions in the case that the breaking load at the time of tail cutting is within the optimum breaking load range, wire bonding conditions in the case that the breaking load at the time of tail cutting is not within the optimum breaking load range, wire bonding conditions in the case that a tail of appropriate length is not formed due to the bond strength being too strong, and the like may be stored in the memory 23.

By seeking wire bonding conditions at which the breaking load at tail cutting time is within the optimum breaking load range and a tail of appropriate length is formed by the arithmetic processing portion 21 referencing this information, it is possible to perform wire bonding at optimum bonding conditions.

Figure 3:
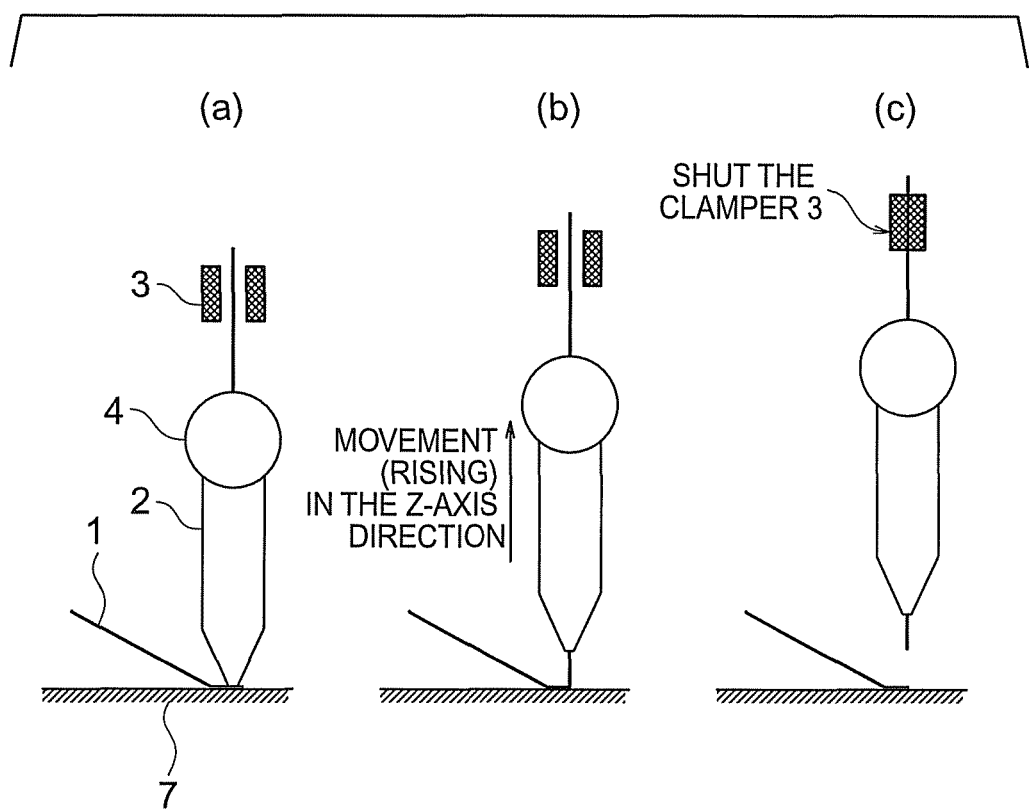
FIG. 3 is a view showing a wire bonding method according to the same embodiment.

A wire bonding method (at the time of tail cutting) will be described using FIG. 3. First, as is shown in FIG. 3 (A), the wire 1 is bonded with the bonding subject 7. After bonding is complete, as is shown in FIG. 3 (B), the capillary 2 is moved (raised) in the Z-axis direction. As shown in FIG. 3 (C), when the capillary 2 has been raised to a prescribed height, the clamper 3 is shut, thereby cutting the wire 1.

The breaking load at this point in time is measured by the load sensor 6 mounted on the clamper supporting portion 5. Then, determination is made by the arithmetic processing portion 21 in the control apparatus 20 as to whether or not the breaking load measured by the load sensor 6 is within the optimum breaking load range.

In a case in which it has been determined that the breaking load is outside of the optimum breaking load range, the apparatus is stopped, and inspection is performed scrutinizing whether the wire 1 of the capillary 2 has buckled. Accordingly, it is possible to prevent wire bonding that uses deformed wire.

In this manner, according to the wire bonding apparatus of the present embodiment, it is possible to suppress wire deformation due to tail cutting action. Also, it is possible to prevent, in advance, wire bonding using deformed wire.

Second Embodiment

Figure 4:
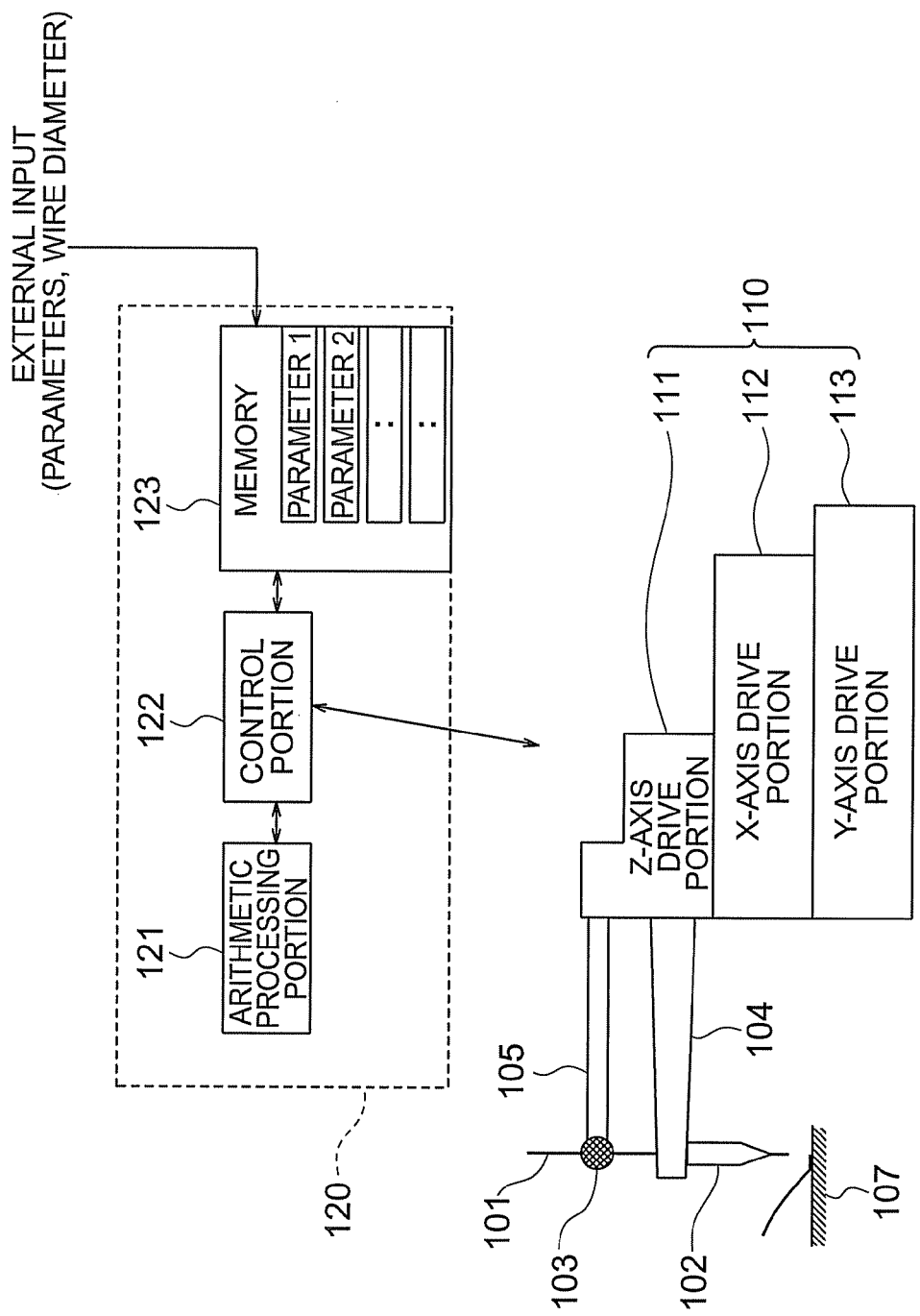
FIG. 4 is a view showing a schematic configuration of a wire bonding apparatus according to a second embodiment of the present invention.

In FIG. 4, a schematic configuration of a wire bonding apparatus according to a second embodiment of the present invention is shown. The wire bonding apparatus includes a capillary 102 configured to have inserted therethrough with a wire 101, a clamper 103 able to clamp hold the wire 101 disposed above the capillary 102, a transducer horn 104 configured at one end to hold in place the capillary 102, a clamper supporting portion 105 which supports the clamper 103 at one end, a capillary moving portion 110 to which the other ends of the transducer horn 104 and the clamper supporting portion 105 are fixed and which is configured to move the capillary 102 and the clamper 103 as one, and a control apparatus 120.

The capillary moving portion 110 includes a Z-axis drive portion 111 configured to move the capillary 102 in a Z-axis direction perpendicular to a bonding subject 107, and an X-axis drive portion 112 and Y-axis drive portion 113 configured to move the capillary 102 in the directions of an X-axis and a Y-axis, which are two orthogonal directions in a plane parallel to a top surface of the bonding subject 107. The Z-axis drive portion 111, X-axis drive portion 112, and Y-axis drive portion 113 are, for example, servo motors.

The control apparatus 120 includes an arithmetic processing portion 121, a control portion 122, and a memory 123. The memory 123 is externally allotted with and stores a plurality of parameters such as control parameters such as ultrasonic output strength and trajectory information of the capillary 102 that defines a loop shape of the wire 101, and parameters such as the wire diameter of the wire 101.

The control portion 122 performs control of the movement of the capillary moving portion 110, opening and shutting of the clamper 103, and control of ultrasonic energy given to the transducer horn 104 at the time of bonding, based on the various parameters stored at the memory 123.

The transducer horn 104 is connected to the Z-axis drive portion 111. According to the electric current value of the Z-axis drive portion 111, it is possible for the control portion 122 to control the load at the time of bonding. Also, the control portion 122 monitors change in the electric current generated in the Z-axis drive portion 111 when the transducer horn 4 rises and wire cutting (tail cutting) is performed. This change in current is a value corresponding to the breaking load at the time of tail cutting.

The arithmetic processing portion 121 calculates the breaking load of the wire 101 from the electric current value (at the time of tail cutting) monitored by the control portion 122. Also, the arithmetic processing portion 121 calculates an optimum breaking load range based on the diameter of the wire 101, and performs determination of whether or not the breaking load at the time of tail cutting is within this optimum breaking load range. When it is determined that the breaking load is not within the optimum breaking load range, a stop signal is sent to the control portion 122 in order to stop the apparatus. The optimum breaking load range may be set arbitrarily by a user.

Also, wire bonding conditions in the case that the breaking load at the time of tail cutting is within the optimum breaking load range, wire bonding conditions in the case that the breaking load at the time of tail cutting is not within the optimum breaking load range, wire bonding conditions in the case that a tail of appropriate length is not formed due to the bond strength being too strong, and the like may be stored in the memory 123.

By seeking wire bonding conditions at which the breaking load at tail cutting time is within the optimum breaking load range and a tail of appropriate length is formed by the arithmetic processing portion 121 referencing this information, it is possible to perform wire bonding at optimum bonding conditions.

According to the wire bonding apparatus of the present embodiment, the breaking load at the time of tail cutting is calculated based on an electric current value of the Z-axis drive portion 111, and in a case in which the breaking load is not within the optimum breaking load range the apparatus is stopped. And according to inspection as to whether the wire 101 within the capillary 102 has buckled, it is possible to prevent the use of deformed wire in subsequent wire bonding.

In this manner, it is possible to suppress wire deformation due to tail cutting action. Also, it is possible to prevent, in advance, wire bonding using deformed wire. Also, since it is not necessary to use the load sensor that measures the breaking load as in the above described first embodiment, it is possible to reduce the cost of the apparatus.

What is claimed is:

1. A wire bonding method comprising:
    bonding a wire in order at a first bonding point and a second bonding point;
    raising a capillary, through which the wire is inserted, on the second bonding point;
    cutting the wire by closing a damper provided above the capillary in response to the capillary reaching a prescribed height;
    measuring a load incurred on the wire at a time of cutting of the wire;
    calculating a prescribed optimum breaking load range so that an upper limit value of the optimum breaking load range becomes a limit value for restricting occurrence of a wire deformation;
    detecting whether the load incurred on the wire at the time of cutting the wire is within the optimum breaking load range; and
    determining whether to continue the bonding based on a result of the detecting,
    wherein in response to determining that bonding is to be continued, the optimum breaking load range is held, and a determination is made regarding whether a second load incurred on the wire at a time of cutting the wire after a next bonding is within the optimum breaking load range.

2. The wire bonding method of claim 1, wherein the measuring comprises measuring the load using a load sensor mounted on a clamper supporting portion that supports the clamper at one end.

3. The wire bonding method of claim 1 wherein an electric current value of a capillary moving portion that moves a transducer horn that supports the capillary at one end is measured, and a load incurred on the wire is calculated based on the electric current value.

4. The wire bonding method of claim 1, further comprising determining the prescribed optimum breaking load range based in part on a diameter of the wire.

* * * * *